United States Patent [19]

Choi

[11] Patent Number: 6,143,466

[45] Date of Patent: Nov. 7, 2000

[54] CHEMICALLY AMPLIFIED PHOTORESIST COMPOSITION

[75] Inventor: Sang-jun Choi, Seoul, Rep. of Korea

[73] Assignee: Samsung Electronics Co., Ltd., Suwon, Rep. of Korea

[21] Appl. No.: 09/399,164

[22] Filed: Sep. 20, 1999

[30] Foreign Application Priority Data

Sep. 21, 1998 [KR] Rep. of Korea ........................ 98-38986
Mar. 24, 1999 [KR] Rep. of Korea ........................ 99-10064

[51] Int. Cl.[7] .............................. G03C 1/73; G03F 7/029; G03F 7/033
[52] U.S. Cl. ........................ 430/270.1; 430/905; 430/910; 526/272; 526/283
[58] Field of Search .................................. 430/270.1, 905, 430/910; 526/272, 283, 323.1, 258; 522/904

[56] References Cited

U.S. PATENT DOCUMENTS

| 5,843,624 | 12/1998 | Houlihan et al. | 430/296 |
| 6,017,680 | 1/2000 | Hattori et al. | 430/313 |
| 6,028,153 | 2/2000 | Jung | 526/258 |
| 6,063,542 | 5/2000 | Hyeon et al. | 430/270.1 |

FOREIGN PATENT DOCUMENTS 2336843  11/1999  United Kingdom .

OTHER PUBLICATIONS

New Norbornene copolymer resin used in photoresists for the manufacture of semiconductors; Baik et al.; CN 1226565 A, abstract; Aug. 26, 1999.

*Primary Examiner*—Janet Baxter
*Assistant Examiner*—Yvette M. Clarke
*Attorney, Agent, or Firm*—Jones Volentine, LLC

[57] ABSTRACT

A chemically amplified photoresist composition, having a large etching resistance and excellent adhesion and contrast characteristics, includes a polymer represented by formula (1):

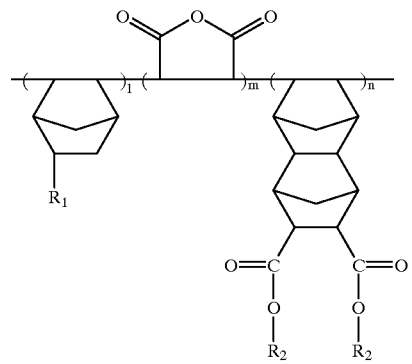

wherein $R_1$ is hydrogen, —OH, —COOH, or aliphatic hydrocarbon having a $C_1$–$C_{20}$ polar functional group, $R_2$ is a t-butyl group, a tetrahydropyranyl group or a 1-alkoxyethyl group, l, m and n are integers, $l/(l+m+n)$ equals 0.0 to 0.4, $m/(l+m+n)$ equals 0.5, $n/(l+m+n)$ equals 0.1 to 0.5, and the weight average molecular weight of the polymer is in the range of 3,000 to 100,000.

5 Claims, No Drawings

CHEMICALLY AMPLIFIED PHOTORESIST COMPOSITION

BACKGROUND OF THE INVENTION

1. Field of the Invention

The present invention relates to a chemically amplified photoresist composition for use with an argon fluoride excimer laser.

2. Description of the Related Art

As semiconductor devices become highly integrated, fine pattern formation is required in a photolithography process. For example, sub-quarter micron or smaller pattern sizes are necessary in a semiconductor memory device having a capacity exceeding 1 Gbit. To achieve such pattern sizes, new types of exposure light sources have been proposed for use, including a photolithography technology employing an argon fluoride (ArF) excimer laser (wavelength: 193 nm) having a wavelength that is shorter than a conventional krypton fluoride (KrF) excimer laser (wavelength: 248 nm). Therefore, there is an increasing demand for developing new chemically amplified photoresist polymers and photoresist compositions that are suitable for use with the ArF excimer laser.

In general, a chemically amplified photoresist composition for an ArF excimer laser must satisfy the following requirements: (1) transparency at a wavelength of 193 nm; (2) excellent thermal properties (for example, high glass transition temperature); (3) good adhesion to film materials above or below; (4) high resistance to dry etching; and (5) easily capable of being developed using developing solutions which are in widespread use in the manufacture of semiconductor devices, for example, 2.38% by weight of tetramethyl ammonium hydroxide (TMAH).

However, a terpolymer comprising methylmethacrylate, t-butyl methacrylate and methacrylic acid, which is a widely known chemically amplified photoresist polymer used with an ArF excimer laser, cannot satisfy the above-described requirements. In particular, the terpolymer has a very low resistance to dry etching and a low adhesion to film materials. Also, when a developing solution widely used for most photoresist layers in a semiconductor manufacturing process is used, even unexposed regions are developed due to an abundance of hydrophilic functional groups bonded to the polymer, for example, carboxyl groups, which changes a critical pattern dimension. Thus, to conduct a development process, a developing solution having a very low concentration must be separately prepared. However, if the concentration of the developing solution is very low, a development reactant becomes very sensitive to a change in concentration of the developing solution. Thus, even a slight change in concentration of the developing solution makes a big difference in the critical dimensions of a resultant development pattern.

Recently, attempts to prepare photosensitive polymers for an ArF excimer laser whose etching resistance is increased have been made by introducing alicyclic compounds, for example, isobornyl, adamantyl or tricyclodecanyl groups, into the backbone of the polymers. However, these polymers also have several disadvantages. For example, their etching resistance and adhesion characteristics to film materials are still poor, which results in lifting of photoresist patterns.

SUMMARY OF THE INVENTION

To solve the above problems, it is an objective of the present invention to provide a chemically amplified photoresist composition capable of being exposed using an ArF excimer laser and having excellent resistance to dry etching.

Accordingly, to achieve the above objective, there is provided a chemically amplified photoresist composition comprising a photosensitive polymer represented by formula (1),

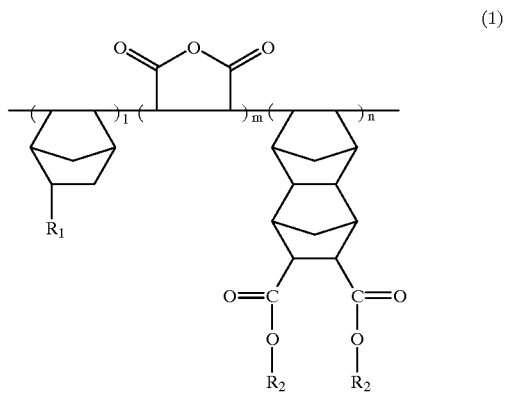

(1)

and a photoacid generator in the range of about 1% to about 15% by weight based on the weight of the photosensitive polymer, wherein $R_1$ is hydrogen, —OH, —COOH, or aliphatic hydrocarbon having a $C_1$–$C_{20}$ polar functional group, $R_2$ is a t-butyl group, a tetrahydropyranyl group or a 1-alkoxyethyl group, l, m and n are integers, $l/(l+m+n)$ equals 0.0 to 0.4, $m/(l+m+n)$ equals 0.5, $n/(l+m+n)$ equals 0.1 to 0.5, and the weight average molecular weight of the polymer is in the range of 3,000 to 100,000.

The composition includes a photoacid generator in a range of about 1% to about 15% by weight based on the total weight of the three-component copolymer. The photoacid generator is one selected from the group consisting of triarylsulfonium salts, diaryliodonium salts, sulfonates and N-hydroxysuccinimide salts.

The chemically amplified photoresist further includes 0.01 to 2.0% by weight of an organic base based on the weight of the photosensitive polymer. The organic base is one selected from the group consisting of triethylamine, triisobutylamine, triisooctylamine, diethanolamine and triethanolamine.

The photosensitive polymer for the chemically amplified photoresist according to the present invention has a cyclic backbone, and thus the etching resistance of the photoresist composition containing the same is large. Specifically, since an alicyclic hydrocarbon group is bonded as a side chain group, the etching resistance is further increased.

DESCRIPTION OF THE PREFERRED EMBODIMENTS

A chemically amplified photoresist composition according to the present invention will now be described. Also, a preferred photolithography process using the chemically amplified photoresist composition will be described. This invention may, however, be embodied in many different forms, and these embodiments are provided so that this disclosure will be thorough and complete, and will fully convey the scope of the invention to those skilled in the art.

Photosensitive Polymer for Chemically Amplified Photoresist

A photosensitive polymer included in the chemically amplified photoresist composition of the present invention is a polymer represented by formula (1):

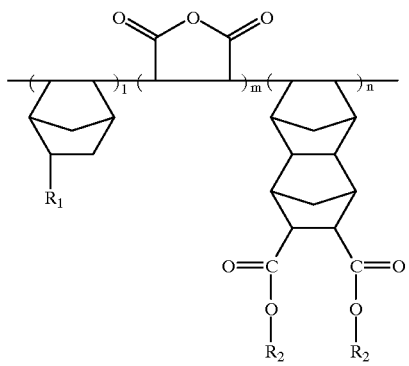

(1)

wherein $R_1$ is hydrogen, —OH, —COOH, or aliphatic hydrocarbon having a $C_1$–$C_{20}$ polar functional group, $R_2$ is a t-butyl group, a tetrahydropyranyl group or a 1-alkoxyethyl group, l, m and n are integers, $l/(l+m+n)$ equals 0.0 to 0.4, $m/(l+m+n)$ equals 0.5, $n/(l+m+n)$ equals 0.1 to 0.5, and the weight average molecular weight of the polymer is in the range of 3,000 to 100,000.

Since the backbone of the photosensitive polymer is cyclic norbornane, the etching resistance thereof is large. In particular, since an alicyclic compound produced by reaction between cyclopentadiene and dialkyloxycarbonyl norbornene is used as a monomer, the etching resistance is further increased. Also, since two dissolution inhibitor groups (—$COOR_2$) are bonded to the backbone, there is a big difference between the solubilities before and after exposure. Further, since $R_1$ is a hydroxy (—OH) group, or an aliphatic hydrocarbon having a $C_1$–$C_{20}$ polar functional group, which is a hydrophilic functional group, the polymer also exhibits good adhesion to underlying layers.

Chemically Amplified Photoresist Composition

A chemically amplified photoresist composition of the present invention includes the above-described photosensitive polymer and a photoacid generator. The photoacid generator is preferably contained in an amount of about 1% to about 15% by weight based on the total weight of the photosensitive polymer. The photoacid generator is preferably a substance that has a high thermal stability. Therefore, suitable photoacid generators include, but are not limited to, triarylsulfonium salts, diaryliodonium salts, sulfonates or N-hydroxysuccinimide salts.

Examples of triarylsulfonium salts include, but are not limited to, triphenylsulfonium triflate, or triphenylsulfonium antimonate. Examples of diaryliodonium salts include, but are not limited to, diphenyliodonium triflate, diphenyliodonium antimonate, methoxydiphenyliodonium triflate or di-t-butyldiphenyliodonium triflate. Examples of sulfonates include, but are not limited to, 2,6-dinitro benzyl sulfonate or pyrogallol tris(alkyl-sulfonates). Examples of N-hydroxysuccinimide salts include, but are not limited to, N-hydroxysuccinimide triflates.

Also, the chemically amplified photoresist composition of the present invention further includes 0.01 to 2.0% by weight of organic base based on the total weight of the photosensitive polymer. Suitable organic bases include, but are not limited to, triethylamine, triisobutylamine, triisooctylamine, diethanolamine or triethanolamine. The organic base is added for preventing a pattern from being deformed due to acidolysis of photoresist composition forming in the unexposed regions after exposure, which results from diffusion of the acid generated at the exposed regions into the unexposed regions.

As described above, the chemically amplified photoresist composition according to the present invention includes a photosensitive polymer having a backbone of cyclic norbornane and an alicyclic compound bonded as a side chain. Therefore, the etching resistance of the photoresist composition is increased. Also, since n×2—$COOR_2$ groups (which form a carboxy group by the acid generated by exposure) are bonded thereto, there is a great difference in polarity of the photoresist composition between exposed regions and unexposed regions.

Method for Preparing Photosensitive Polymer

1. Synthesis of Monomer

1-1. Synthesis of di(alkyloxycarbonyl) norbornene (III)

5-norbornene-2,3-dicarbonyl chloride (I) and potassium alkoxide (II) are reacted in tetrahydrofuran (THF) solvent to prepare di(alkyloxycarbonyl) norbornene (III) as expressed in the following reaction formula (1):

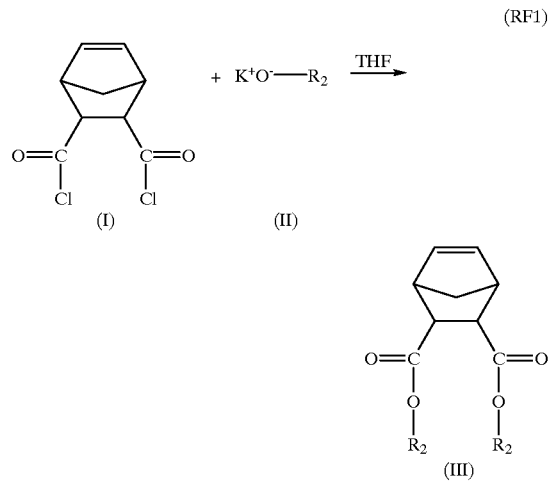

(RF1)

wherein $R_2$ is a t-butyl group, a tetrahydropyranyl group or a 1-alkoxyethyl group.

1-2. Synthesis of Monomer (V)

Cyclopentadiene (IV) is dissolved in an organic solvent and then di(alkyloxycarbonyl)norbornene (III) is added thereto to prepare a monomer (V) as expressed in the following reaction formula (2):

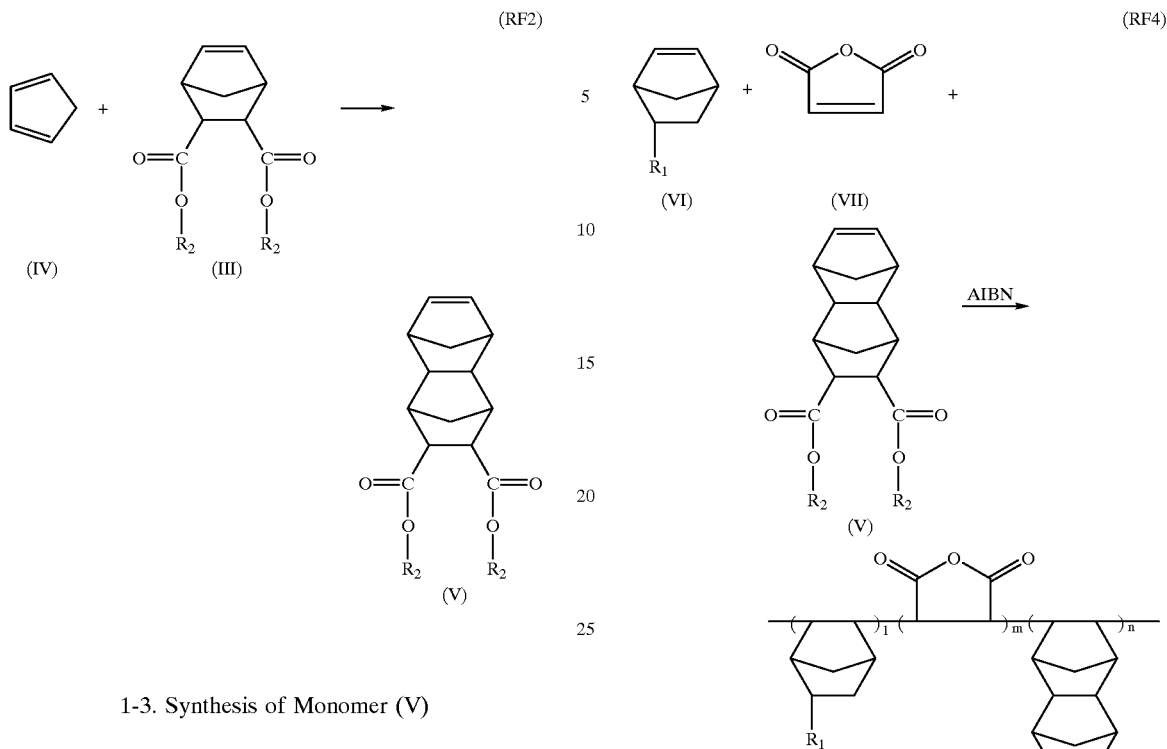

1-3. Synthesis of Monomer (V)

Alternatively, the above monomer (V) can be prepared by reacting dicyclopentadiene and di-alkyl fumarate at 180° C. as in the following reaction formula (3):

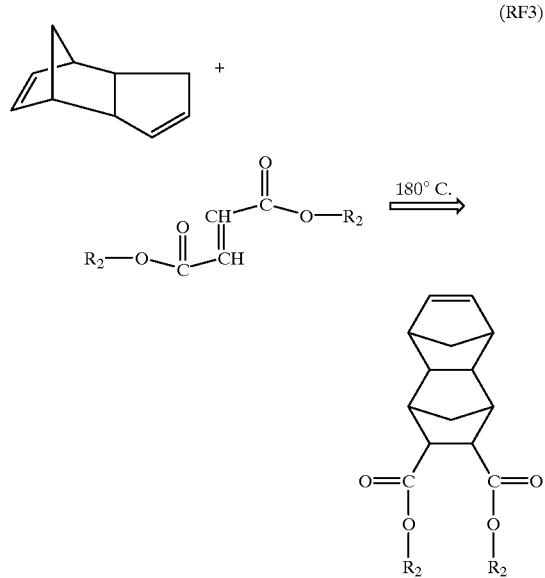

2. Synthesis of Terpolymer

The monomer (V), alkyl norbornene (VI) and anhydrous maleic acid (VII) are dissolved in an organic solvent, for example, toluene, and then a polymerization initiator, e.g., azobisisobutyronitrile (AIBN) is added thereto to carry out polymerization to prepare a terpolymer (VIII), as expressed in the following reaction formula (4):

wherein $R_1$ is hydrogen, —OH, —COOH, or aliphatic hydrocarbon having a $C_1$–$C_{20}$ polar functional group, $R_2$ is a t-butyl group, a tetrahydropyranyl group or a 1-alkoxyethyl group, l, m and n are integers, $l/(l+m+n)$ equals 0.0 to 0.4, $m/(l+m+n)$ equals 0.5, $n/(l+m+n)$ equals 0.1 to 0.5, and the weight average molecular weight of the polymer is in the range of 3,000 to 100,000.

Method for Preparing Chemically Amplified Photoresist Composition and Photolithography Process Using the Same The chemically amplified photoresist composition according to the present invention is prepared by dissolving the photosensitive polymer expressed in formula (1) and a photoacid generator in an appropriate solvent and mixing the same.

Here, the photoacid generator is mixed in an amount of about 1% to about 15% by weight based on the weight of the polymer. Triarylsulfonium salts, diaryliodonium salts, sulfonates or N-hydroxysuccinimide salts which are thermally stable are preferably used as the photoacid generator.

Also, it is preferable to complete the photoresist composition by further dissolving 0.01 to 2.0% by weight of an organic base based on the weight of the polymer. Triethylamine, triisobutylamine, triisooctylamine, diethanolamine or triethanolamine are preferably used as the organic base.

The chemically amplified photoresist composition prepared in the above-described manner can be used for a general photolithography process as described below, and is particularly suitable for forming a fine pattern to satisfy a design rule of 0.20 μm or smaller using an ArF excimer laser as an exposure light source.

First, the photoresist composition is coated on a substrate, where a patterning object material was previously formed, to form a photoresist layer having a predetermined thickness. Since a hydroxy group is bonded to the photosensitive polymer forming the photoresist composition according to the present invention, the photoresist composition exhibits strong adhesion to underlying film materials. Therefore, coating of the photoresist layer is relatively easy. Also, a photoresist pattern to be completed in a subsequent process is not lifted.

Subsequently, pre-baking is carried out on the photoresist layer. After the pre-baking step, the photoresist layer is exposed using a mask having a predetermined pattern, using an ArF excimer laser as an exposure light source. The exposure causes acid to be generated in the photoacid generator contained in the photoresist layer. The photosensitive polymer is acidolyzed by the catalytic action of the thus-generated acid to form an abundance of carboxy groups, as expressed in reaction formula 5:

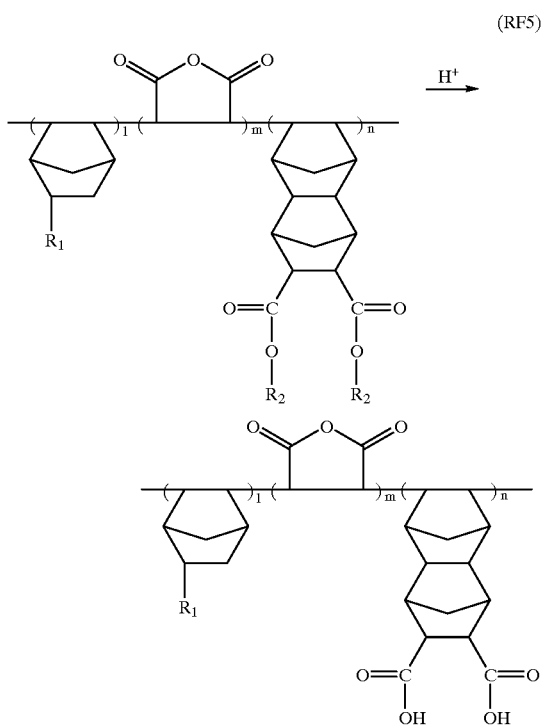

(RF5)

After exposure, the photoresist layer is thermally treated for a short time before development, which is referred to a post-exposure-thermal treatment. The post-exposure-thermal treatment is performed for the purpose of increasing contrast by further activating acidolysis of exposed regions by the acidic catalyst to acidolyze dissolution inhibitor groups (—COOR$_2$) contained in the photosensitive polymer into carboxy groups.

Next, development is performed using an appropriate developing solution to complete a photoresist pattern. Here, the developing solution used is a developing solution for general development processes, for example, 2.38% by weight of TMAH.

After forming the photoresist pattern, a patterning object layer is etched to form a desired pattern. The photoresist pattern of the present invention is formed of a photoresist layer including a photosensitive polymer having a cyclic backbone and an alicyclic hydrocarbon bonded as a side chain, and thus the etching resistance thereof is large. Therefore, a pattern having a good profile, that is, having a precise critical dimension, can be formed.

The present invention will now be described in more detail with reference to the following examples and should not be construed as limited thereto.

EXAMPLE 1

Synthesis of Monomer

EXAMPLE 1-1: Synthesis of 2,3-di-t-butoxycarbonyl 5-norbornene 34 g (0.3 mol) of potassium t-butoxide was dissolved in 250 mL of THF in a round-bottom flask and then 22 g (0.1 mol) of 5-norbornene-2,3-dicarbonyl chloride was slowly added thereto at room temperature to be reacted at 45° C. for about 12 hours.

After the reaction was complete, the reactant material was dissolved in excess water to filter precipitate, neutralized using HCl and then extracted using diethyl ether. The reactant material was dried using MgSO$_4$ and then redissolved in an n-hexane/methylene chloride solution. Finally, a reactant product was separated using a recrystallizing method (yield: 80%).

EXAMPLE 1-2: Synthesis of Monomer 7.3 g (0.11 mol) of cyclopentadiene obtained by distillating dicyclopentadiene was dissolved in 150 mL of methylene chloride in a round-bottom flask and then 29.4 g (0.1 mol) of 2,3-di-t-butoxycarbonyl 5-norbornene was slowly added thereto at room temperature to be reacted at room temperature for about 24 hours.

After the reaction was complete, excess solvent was evaporated and then the reactant material was recrystallized using methanol to then be purified, thereby acquiring a compound (V) wherein R$_2$ is a t-butyl group (yield: 80%).

EXAMPLE 1-3: Synthesis of Monomer 44 g (0.33 mol) of dicyclopentadiene and 68.5g (0.3 mol) di-t-butyl fumarate were reacted in an autoclave maintained at 180° C. for about 24 hours. After the reaction was complete, a monomer wherein R$_2$ is a t-butyl group was acquired by vacuum distillation or column chromatography (yield: 30%).

EXAMPLE 2: Synthesis of Terpolymer

Example 2-1

A polymer represented in formula (1), wherein R$_1$ is —CH$_2$OH and R$_2$ is a t-butyl group, was prepared in the following manner.

14.5 g (40 mmol) of monomer prepared in Example 1-2, 1.3 g (10 mmol) of 5-norbornene-2-methanol, and 4.9 g (50 mmol) of anhydrous maleic acid were dissolved in 25 g of dioxane anhydride. 0.16 g of AIBN was added to the resultant, purged using N$_2$ gas for about 1 hour and polymerized at a temperature of about 65° C. for about 24 hours.

After the polymerization was complete, the reactant material was precipitated in excess n-hexane and the precipitate was dissolved again in THF to then be reprecipitated. The precipitate was filtered using a glass filter and then dried in a vacuum oven maintained at about 50° C. for about 24 hours to separate the reactant product.

The weight average molecular weight and polydispersity of the obtained reactant product were 13,600 and 2.1, respectively.

Example 2-2

A polymer represented in formula (1), wherein $R_1$ is —COOH and $R_2$ is a t-butyl group, was prepared in the following manner.

The polymer was prepared in the same manner as in Example 2-1, except that 16.3 g (45 mmol) of monomer prepared in Example 1-2, 0.7 g (5 mmol) of 5-norbornene-2-carboxylic acid, and 4.9 g (50 mmol) of anhydrous maleic acid were used.

The weight average molecular weight and polydispersity of the obtained reactant product were 12,800 and 2.1, respectively.

EXAMPLE 3

Method for Preparing Photoresist Composition and Photolithography Process Using the Same Example 3-1

1.0 g of the terpolymer prepared in Example 2-1, as a photosensitive polymer, l:m:n being 2:10:8 and the weight average molecular weight being 13,600, and 0.02 g of triphenylsulfornium triflate as a photoacid generator, were dissolved in 6.0 g of propylene glycol monomethyl ether acetate and then sufficiently stirred. Subsequently, the mixture was filtered using a 0.2 µm filter, resulting in a photoresist composition.

The acquired photoresist composition was spin-coated on a wafer where a patterning object material layer and hexamethyldisilazane were coated to a thickness of about 0.5 µm. The photoresist composition coated wafer was softbaked at a temperature of about 140° C. for about 90 seconds, exposed using a mask defining a 0.30 µm line and space pattern and an ArF excimer laser (NA: 0.6) as an exposure light source, and post-baked at a temperature of about 140° C. for about 90 seconds. Thereafter, the resultant was developed using 2.38% by weight of TMAH for about 60 seconds, thereby forming a photoresist pattern.

As a result, a 0.30 µm line and space photoresist pattern having an excellent profile was obtained at an exposure dose of about 17 mJ/cm². Also, a material layer pattern having an excellent pattern profile was obtained using the photoresist pattern.

Example 3-2

A photoresist composition was prepared in the same manner as in Example 3-1, except that 2 mg of triethanolamine as an organic base was added, and then a photolithography process was performed.

As a result, a 0.30 µm line and space photoresist pattern having an excellent profile was obtained at an exposure dose of about 26 mJ/cm².

Example 3-3

A photolithography process was performed in the same manner as in Example 3-1, except that 1.0 g of the terpolymer prepared in Example 2-2, as a photosensitive polymer, l:m:n being 1:10:9 and the weight average molecular weight being 12,800, was used.

As a result, a 0.30 µm line and space photoresist pattern having an excellent profile was obtained at an exposure dose of about 13 mJ/cm².

Example 3-4

A photolithography process was performed in the same manner as in Example 3-3, except that 2 mg of triethanolamine as an organic base was added.

As a result, a 0.30 µm line and space photoresist pattern having an excellent profile was obtained at an exposure dose of about 21 mJ/cm².

Since the backbone of the photosensitive polymer is cyclic norbornane, the etching resistance thereof is large. In particular, since an alicyclic compound produced by reaction between cyclopentadien and dialkyloxycarbonyl norbornene is used as a monomer, the etching resistance is further increased. Also, since two dissolution inhibitor groups (—COOR$_2$) are bonded to the backbone, there is a big difference between the solubility before and after exposure. Further, since $R_1$ is a hydroxy (—OH) group, or an aliphatic hydrocarbon having a $C_1$–$C_{20}$ polar functional group, which is a hydrophilic functional group, the polymer also exhibits good adhesion to underlying layers.

Accordingly, the photoresist composition according to the present invention including the photosensitive polymer exhibits a large etching resistance. Also, since there is a great difference in polarity of the photoresist composition between exposed regions and unexposed regions, the contrast is increased. Further, occurrence of lifting of the photoresist pattern is remarkably reduced due to excellent adhesion.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A chemically amplified photoresist composition comprising: a photosensitive polymer represented by formula (1)

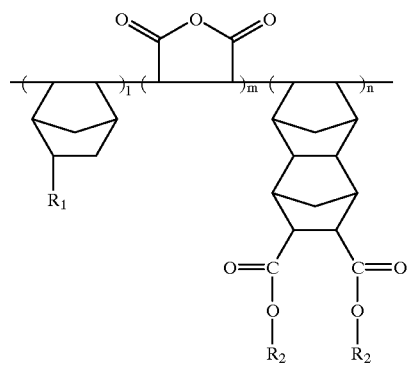

and a photoacid generator in a range from about 1% to about 15% by weight based on the weight of the photosensitive polymer, wherein $R_1$ is hydrogen, —OH, —COOH, or aliphatic hydrocarbon having a $C_1$–$C_{20}$ polar functional group, $R_2$ is a t-butyl group, a tetrahydropyranyl group or a 1-alkoxyethyl group, l, m and n are integers, l/(l+m+n) equals 0.0 to 0.4, m/(l+m+n) equals 0.5, n/(l+m+n) equals 0.1 to 0.5, and the weight average molecular weight of the polymer is in the range of 3,000 to 100,000.

2. The chemically amplified photoresist composition according to claim 1, wherein the photoacid generator is one selected from the group consisting of triarylsulfonium salts, diaryliodonium salts, sulfonates and N-hydroxysuccinimide salts.

3. The chemically amplified photoresist composition according to claim 2, wherein the triarylsulfonium salts include triphenylsulfonium triflate and triphenylsulfornium antimonate, the diaryliodonium salts include diphenyliodonium triflate, diphenyliodonium antimonate, methoxydiphenyliodonium triflate and di-t-butyldiphenyliodonium triflate, the sulfonates include 2,6-dinitro benzyl sulfonate or pyrogallol tris(alkyl-sulfonates), and the N-hydroxysuccinimide salts include N-hydroxysuccinimide triflates.

4. The chemically amplified photoresist composition according to claim 1, further comprising 0.01 to 2.0% by weight of an organic base based on the weight of the photosensitive polymer.

5. The chemically amplified photoresist composition according to claim 4, wherein the organic base is one selected from the group consisting of triethylamine, triisobutylamine, triisooctylamine, diethanolamine and triethanolamine.

* * * * *